(12) United States Patent
Iijima et al.

(10) Patent No.: US 7,071,071 B2
(45) Date of Patent: Jul. 4, 2006

(54) METHOD OF MANUFACTURING SEMICONDUCTOR DEVICE

(75) Inventors: Shinpei Iijima, Tokyo (JP); Keiji Kuroki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/801,003

(22) Filed: Mar. 16, 2004

(65) Prior Publication Data
US 2004/0227175 A1 Nov. 18, 2004

(30) Foreign Application Priority Data
Mar. 19, 2003 (JP) .............................. 2003-075955

(51) Int. Cl.
*H01L 21/8242* (2006.01)
(52) U.S. Cl. ...................... 438/396; 438/253; 438/256; 438/686
(58) Field of Classification Search ................ 438/253, 438/256, 396, 686, FOR. 220, FOR. 430, 438/210, 239, 240, 243, 244, 386, 387
See application file for complete search history.

(56) References Cited

U.S. PATENT DOCUMENTS

| 4,461,744 | A | * | 7/1984 | Erni et al. ............. 422/186.18 |
| 5,976,977 | A | * | 11/1999 | Hong .......................... 438/689 |
| 6,664,157 | B1 | * | 12/2003 | Iijima et al. ................ 438/238 |
| 6,756,262 | B1 | * | 6/2004 | Nakamura et al. .......... 438/240 |
| 6,797,583 | B1 | * | 9/2004 | Song ........................... 438/396 |
| 6,873,002 | B1 | * | 3/2005 | Nishikawa .................. 257/308 |
| 2001/0038114 | A1 | * | 11/2001 | Iijima et al. ................ 257/303 |
| 2002/0192896 | A1 | * | 12/2002 | Matsui et al. ............... 438/239 |
| 2003/0059959 | A1 | * | 3/2003 | Hong ............................ 438/3 |

FOREIGN PATENT DOCUMENTS

| JP | 9-129849 | 5/1997 |
| JP | 9-246490 | 9/1997 |
| JP | 2000-012796 | 1/2000 |
| JP | 2001-94071 | 4/2001 |
| JP | 2001-210802 | 8/2001 |
| JP | 2001-313379 | 11/2001 |

* cited by examiner

*Primary Examiner*—George Fourson
*Assistant Examiner*—Joannie Adelle Garcia
(74) *Attorney, Agent, or Firm*—Young & Thompson

(57) ABSTRACT

A lower electrode of a capacitor element is formed by manufacturing a crown structure while using a first conducting material such as titanium nitride or the like excellent in mechanical strength as a base material and by forming a film of a second conducting material such as ruthenium or the like, which is comparatively difficult to be oxidized, on a surface of the crown structure. First, ruthenium is deposited on a surface of the crown structure by using a sputtering method. Thereafter, the ruthenium (sputtered ruthenium) placed in a peripheral region of the crown structure is removed by etching, and a film of ruthenium is further formed on a surface of the crown structure by using a CVD method while using the sputtered ruthenium as a seed layer.

1 Claim, 16 Drawing Sheets

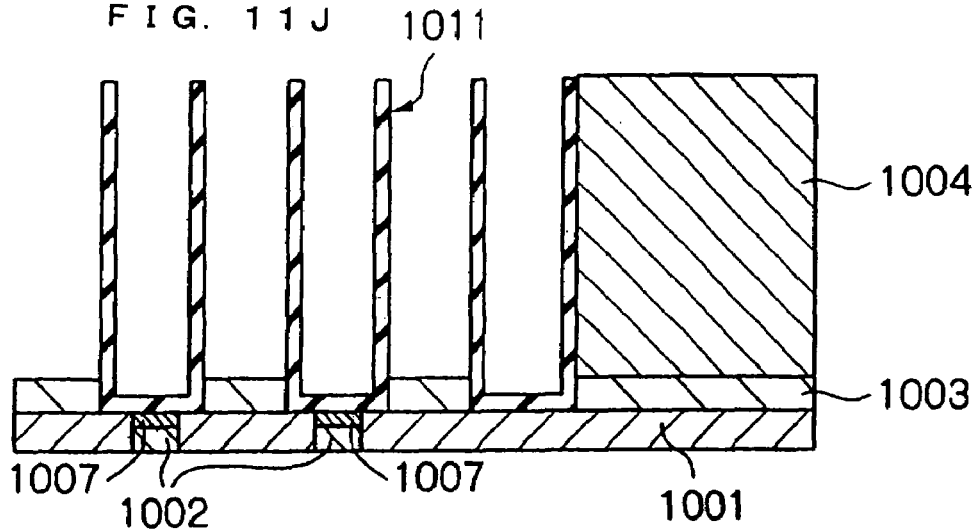
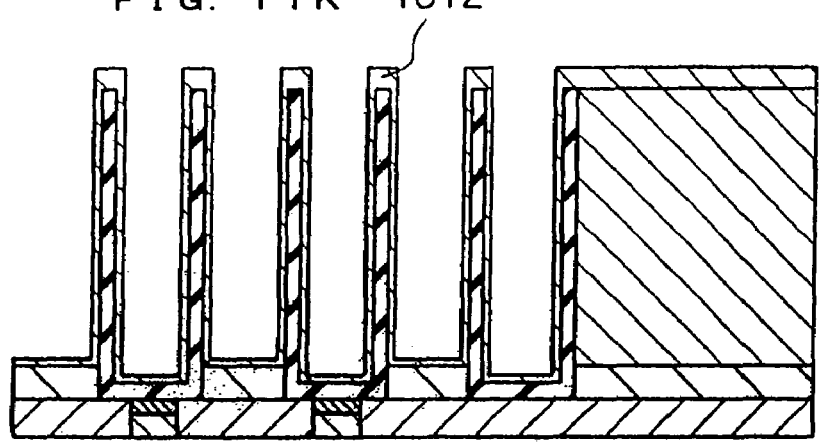
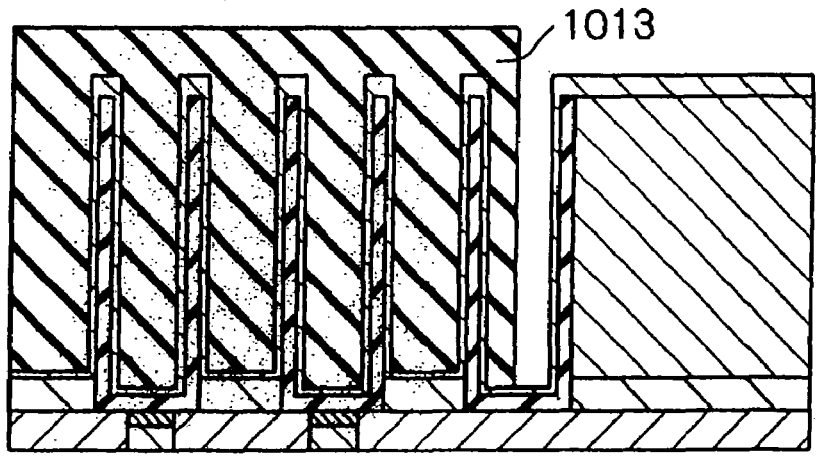

METHOD OF MANUFACTURING SEMICONDUCTOR DEVICE

BACKGROUND OF THE INVENTION

1. Field of the Invention

The present invention relates to a semiconductor integrated circuit device having a capacitor element and a method of manufacturing the device.

2. Description of the Related Art

An MIS structure composed of an upper metal electrode, a dielectric and a lower silicon electrode is currently adopted for a capacitor element of a dynamic random access memory (DRAM) merchandised as a product. To secure the performance of DRAM, the capacitance of the capacitor element is required to maintain a constant value. However, because the size of a memory cell is reduced due to the high integration each time the product generation alternates, the area and volume allowed for layout of the capacitor element are reduced, and it becomes difficult to secure the capacitance of the capacitor element.

A capacitor element of DRAM has a lower electrode denoting an accumulation electrode, an upper electrode denoting a plate electrode and a dielectric insulating film placed between the lower electrode and the upper electrode. As is well known, when the thickness of the dielectric insulating film is decided, the capacitance of the capacitor element is decided according to areas of the lower electrode and the upper electrode and the dielectric constant of the dielectric insulating film. As a technique for securing the areas of the lower electrode and the upper electrode, a method of enlarging an effective area by forming uneven portions on a surface of an electrode has been already used. Further, as a technique for improving the dielectric constant of the capacitor element, the configuration using a material of a high dielectric constant such as tantalum oxide or the like has been already used. However, even though these methods of securing the capacitance were adopted, because further integration is required for DRAM in recent years, it is becoming difficult to secure a space for forming uneven portions on the surface of the lower electrode. Further, in the MIS structure obtained by using silicon for the lower electrode and using tantalum oxide for the dielectric insulating film, a problem arises that silicon oxide having a low dielectric constant is inevitably formed on a boundary face between the silicon and tantalum oxide. Therefore, the improvement of the dielectric constant is gradually reaching a limit.

To solve the above-described problems, an MIM structure using metal as a material of the lower electrode has been examined. The MIM structure is composed of an upper metal electrode, a dielectric and a lower metal electrode. In case of the MIM structure, the problem of limiting the dielectric constant in the MIS structure can be avoided.

However, when the MIM structure is adopted, a new problem arises in that a leak current increases. Many metals such as titanium nitride, tungsten and the like already used for the semiconductor integrated circuit device are considerably easily oxidized. Therefore, in the structure using an easily-oxidized metal for the lower electrode as it is, tantalum oxide film is formed on the lower electrode, and heat treatment is performed for the tantalum oxide film in the oxygen atmosphere to introduce oxygen into oxygen defects of the tantalum oxide film. However, because oxygen is consumed in the lower electrode made of metal, a capacitor element is formed while the oxygen defects remain in the tantalum oxide film regardless of the heat treatment.

When oxygen defects exist in the dielectric insulating film of the capacitor element, even though attempts to accumulate a charge in the capacitor element, a leak current between the electrodes through the oxygen defects is increased. Therefore, the capacitor element becomes defective.

To avoid this problem, it is effective to use a conducting material such as platinum, ruthenium, iridium or the like, which is comparatively difficult to oxidize, for the lower electrode. Further, to manufacture a capacitor element having a three-dimensional structure, in view of securing step coverage, it is required to satisfy a necessary condition that the capacitor element can be formed according to a chemical vapor deposition (CVD) method and another necessary condition that the capacitor element can be processed. To satisfy these conditions, ruthenium is the most preferable as a material.

The configuration of DRAM will be now described.

FIG. 1 is a sectional view showing an example of the configuration of DRAM.

DRAM shown in FIG. 1 has a memory array region and a peripheral circuit region. Memory cells are formed in the memory array region, and circuits for writing and reading out information in/from the memory cells are formed in the peripheral circuit region.

As shown in FIG. 1, in the memory array region, first p-well layer 103 (p-type impurity diffusion layer) is formed in p-type silicon substrate 101 (semiconductor substrate) ranging from a surface thereof to a position of a predetermined depth, and n-well layer 102 (n-type impurity diffusion layer) is formed so as to surround a side surface and a bottom surface of first p-well layer 103. In the peripheral circuit region, second p-well layer 104 (p-type impurity diffusion layer) is formed in p-type silicon substrate 101 (semiconductor substrate) ranging from the surface thereof to a position of another predetermined depth. N-well layer 102 and second p-well layer 104 are insulated and separated from each other by element separation region 105.

Next, the configuration of transistors of a memory cell will be described.

In FIG. 1, transistors 106 and 107 are formed in first p-well layer 103. Transistor 106 has both drain electrode 108 and source electrode 109a formed in first p-well layer 103 and gate electrode 111a formed on first p-well layer 103 through gate insulating film 110. Transistor 107 has drain electrode 112a, gate electrode 111b formed on gate insulating film 110 and source electrode 109a common with transistor 106. Transistors of a memory cell such as transistors 106 and 107 and the like are covered with first interlayer insulating film 113.

Each of transistors 106 and 107 is used as a switching element for selecting a capacitor element, gate electrodes 111a and 111b are used as word lines, and a bit line is connected to source electrode 109a.

Each transistor of the memory cell described above is an n-type metal oxide semiconductor (MOS) in which each of a drain electrode and a source electrode is composed of an n-type impurity diffusion layer. Because transistor 106 has the same configuration as that of transistor 107, the configuration of the memory array region will be described in detail below by using transistor 107 and a capacitor element connected with transistor 107 as an example.

The configuration of a bit line connected with a transistor will be initially described.

A bit line is connected with source electrode 109a through both polycrystalline silicon 115 packed in contact hole 114 formed in first interlayer insulating film 113 and a bit line contact placed on polycrystalline silicon 115. The bit line is configured by stacking up tungsten nitride 119 and tungsten 120 in that order. The bit line contact is configured by stacking up titanium silicide 116, titanium nitride 117 and tungsten 118. A side surface and an upper surface of the bit line are covered with second interlayer insulating film 121.

Next, the configuration of a capacitor element of the memory cell will be described.

A capacitor element has lower electrode 124a, upper electrode 126 and insulating film 125 placed between lower electrode 124a and upper electrode 126. Lower electrode 124a is formed in a shape and has a circular bottom and a cylindrical side wall (hereinafter, called crown structure), and the side wall and the bottom of an opening of lower electrode 124a are covered with dielectric insulating film 125. Upper electrode 126 is formed so as to cover the entire memory array region, and fourth interlayer insulating film 127 is formed on upper electrode 126.

Lower electrode 124a is connected with drain electrode 112a of transistor 107 through silicon plug 122 penetrating through both first interlayer insulating film 113 and second interlayer insulating film 121. Silicon plug 122 is configured by packing silicon in a contact hole placed at predetermined positions of first interlayer insulating film 113 and second interlayer insulating film 121. A capacitor element having lower electrode 124b, dielectric insulating film 125 and upper electrode 126 is connected with drain electrode 108 of transistor 106.

Next, the configuration of transistor 150 and wiring formed in the peripheral circuit region will be described.

Transistor 150 has both source electrode 109b and drain electrode 112b formed in second p-well layer 104 and gate electrode 111c formed on gate insulating film 110.

Drain electrode 112b is connected with a first wiring layer through metal buried in contact hole 128 formed at a predetermined position of first interlayer insulating film 113. In contact hole 128, titanium silicide 116, titanium nitride 117 and tungsten 118 are packed in that order.

The first wiring layer has tungsten nitride 119 and tungsten 120. The first wiring layer is connected with a second wiring layer through tungsten nitride 130 and tungsten 131 packed in contact hole 129 penetrating through second interlayer insulating film 121, third interlayer insulating film 123 and fourth interlayer insulating film 127. The second wiring layer connected with the first wiring layer has titanium nitride 132, aluminum 133 and titanium nitride 134.

In upper electrode 126 provided in the memory array region, leader wiring 135, of which a portion reaches the peripheral circuit region, is arranged. Leader wiring 135 is connected with the second wiring layer through both titanium nitride 136 and tungsten 137 packed in a contact hole arranged in a predetermined position of fourth interlayer insulating film 127. The second wiring layer connected with leader wiring 135 has titanium nitride 138, aluminum 139 and titanium nitride 140. Gate electrode wiring 111d acting as a wiring is formed on element separation region 105 insulating and separating n-well layer 102 from second p-well layer 104.

Here, transistor 150 is formed of an n-type MOS. However, in the peripheral circuit region, a p-type MOS transistor (not shown), in which each of a drain electrode and a source electrode is composed of a p-type impurity diffusion layer, is also arranged in an n-well layer (not shown) composed of an n-type impurity diffusion layer.

In the memory array region and the peripheral circuit region, a interlayer insulating film, a contact and a wiring layer not shown are, if necessary, formed on the second wiring layer. As described above, DRAM is formed (for example, refer to Published Unexamined Japanese Patent Application No. 2001-94071).

Next, a method of manufacturing capacitor elements of DRAM shown in FIG. 1 will be described. Each capacitor element described below is configured by using ruthenium for a lower electrode.

FIGS. 2A to 2G are sectional views showing a process of manufacturing conventional capacitor elements. The detailed description of the process of forming the transistor is omitted. Further, openings of a contact hole and the like and patterns of a wiring and the like are formed, in case of no specific description, by using a known lithography process and a known etching process.

As shown in FIG. 2A, first interlayer insulating film 203 is formed so as to cover word lines 202 composed of a conductive film formed on silicon substrate 201.

Thereafter, contact holes are formed in first interlayer insulating film 203, and first silicon plugs 204 are formed by packing silicon into the contact holes. Word lines 202 are gate electrodes of transistors formed on a gate insulating film not shown, and the contact holes are arranged at positions at which a source electrode and drain electrodes not shown are formed in silicon substrate 201.

Then, after second interlayer insulating film 205 is deposited on first interlayer insulating film 203, an opening is formed in second interlayer insulating film 205 so as to expose an upper surface of one first silicon plug 204 connected with the source electrode, and bit line contact 206 is formed by packing a conductive film into the opening. Thereafter, a bit line 207 connected with bit line contact 206 is formed.

Thereafter, third interlayer insulating film 208 composed of silicon oxide and fourth interlayer insulating film 209 composed of silicon nitride are deposited in that order on second interlayer insulating film 205. Thereafter, openings penetrating through second interlayer insulating film 205, third interlayer insulating film 208 and fourth interlayer insulating film 209 are formed so as to expose upper surfaces of the other first silicon plugs 204 connected with drain electrodes, and second silicon plugs 210 are formed by packing silicon into the openings.

Thereafter, as shown in FIG. 2B, upper portions of second silicon plugs 210 are removed by etching, and recesses 211 are formed so as to place upper surfaces of second silicon plugs 210 at a position corresponding to almost half of a film thickness of fourth interlayer insulating film 209.

Then, after titanium nitride is formed on the entire surface of fourth interlayer insulating film 209 so as to sufficiently bury the recesses 211, the titanium nitride placed on no recess is removed. Thereafter, barrier metal 212 is buried into each of recesses 211 (FIG. 2C). Barrier metals 212 are arranged to prevent the reaction between silicon of second silicon plugs 210 and a film of ruthenium formed later. It is preferable that these barrier metals 212 are formed according to a CVD method having excellent step coverage.

Then, after fifth interlayer insulating film 213 composed of silicon nitride and sixth interlayer insulating film 214 composed of silicon oxide having a film thickness of almost 1.5 μm are deposited on the fourth interlayer insulating film 209, portions of fifth interlayer insulating film 213 and sixth interlayer insulating film 214 are removed at predetermined positions by etching until upper surfaces of barrier metals 212 are exposed, and cylinders 215 shaped in a cylindrical hole are formed (refer to FIG. 2D).

Thereafter, as shown in FIG. 2E, ruthenium having a film thickness of almost 5 nm is deposited on the entire surface by using a sputtering method, and a film of ruthenium 216 having a film thickness of almost 30 nm is formed according to the CVD method. Ruthenium formed according to the sputtering method acts as seed crystal (seed layer) of ruthenium formed according to the CVD method. Hereinafter, ruthenium formed according to the sputtering method is called sputtered ruthenium, and ruthenium formed according to the CVD method is called CVD ruthenium.

A film of the CVD ruthenium is formed by arbitrarily diluting ethylcyclopentadienylruthenium ($Ru[C_2H_5C_5H_4]_2$: hereinafter, abbreviated to $Ru(EtCp)_2$) with solvent such as tetrahydrofuran (THF) or the like (solvent other than THF is allowed) and reacting obtained vaporized gas with oxygen at a temperature of almost 300° C. After forming a film of the CVD ruthenium, the entire surface is coated with photoresist, is exposed to light and is developed so as to make photoresist 217 remain only in cylinders 215.

Thereafter, exposed ruthenium not covered with photoresist 217 is removed by an anisotropic dry etching using oxygen gas plasma. Further, photoresist 217 is removed by using solution having organic acid such as phenolalkylbenzenesulfonic acid as a main component, and cylinders 215, of which inner walls are covered with ruthenium 216, are formed (FIG. 2F).

Thereafter, as shown in FIG. 2G, sixth interlayer insulating film 214 supporting side walls composed of ruthenium 216 is removed, and lower electrodes of crown structures are formed. To remove sixth interlayer insulating film 214, a wet etching using solution having hydrofluoric acid as a main component is performed. Because fifth interlayer insulating film 213 placed under sixth interlayer insulating film 214 is composed of silicon nitride little etched by hydrofluoric acid, the etching performed for sixth interlayer insulating film 214 by using hydrofluoric acid is stopped by fifth interlayer insulating film 213.

In the manufacturing method described above, as shown in FIG. 2G, when sixth interlayer insulating film 214 is removed by the wet etching, because the support for the lower electrodes composed of ruthenium 216 is lost, a breakage 218 occurs. Or, a problem arises that at least one lower electrode collapses. Due to this problem, a capacitor element impossible to sufficiently accumulate charge is formed, and yield of DRAM is considerably lowered. Particularly, this problem frequently occurs when vibration is added during the wet etching process. Further, the breakage 218 or the collapse sometimes occurs due to heat treatment performed in a process of forming an insulating film after or the like the wet etching.

To examine causes of the above described problem, a film structure of ruthenium was observed, and an observed result will be described.

FIGS. 3A and 3B are modeling views showing a result of a cross section of a ruthenium film observed by using a transmission electron microscope. Particularly, FIG. 3A is a view showing a condition obtained just after forming ruthenium according to the CVD method, and FIG. 3B is a view showing a condition obtained after performing heat treatment for an observed sample.

The observed sample is obtained by forming silicon oxide 302 on a surface of silicon substrate 301, depositing ruthenium acting as seed crystal at a thickness of 5 nm according to the sputtering method and forming a film of ruthenium 303 at a film thickness of 30 nm according to the CVD method.

Even though ruthenium 303 is observed as a flat film by using a scanning electron microscope of almost two hundred thousand magnification, when ruthenium 303 is observed by using a transmission electron microscope of almost four million magnifications, as shown in FIG. 3A, it is realized that ruthenium 303 grows in a pole-like shape and do not form into a continuous film. Further, each of poles of ruthenium 303 is not vertical, but most of them are inclined. Therefore, adjacent poles come in contact with each other at head top portions of the poles, and spaces exist around each pole.

As shown in FIG. 3B, when heat treatment is performed for ruthenium 303 shown in FIG. 3A, poles are moved due to the heat treatment, the spaces are taken into the film of ruthenium 303, and the spaces remain in ruthenium 303 as voids 305.

Further, the film thickness of ruthenium 303 does not become uniform even after the heat treatment, a large number of thinned portions exist in the film, and deficiencies 306 having no ruthenium are generated. Because voids 305 and the thinned portions in the film lower the mechanical strength of the film, voids 305 and the thinned portions cause the lower electrodes to break or collapse.

SUMMARY OF THE INVENTION

An object of the present invention is to provide a semiconductor integrated circuit device having a capacitor element, which has a lower electrode of a crown structure excellent in mechanical strength, and a method of manufacturing the device.

To achieve the object, a semiconductor integrated circuit device according to the present invention is configured by manufacturing a crown structure while using a first conducting material such as titanium nitride or the like excellent in mechanical strength as a base material of a lower electrode of a capacitor element and by forming a film of a second conducting material such as ruthenium or the like, which is comparatively difficult to be oxidized, on a surface of the crown structure.

The crown structure using the first conducting material such as titanium nitride or the like as a base material becomes strong structurally for burdens such as vibration, heat and the like given during the manufacturing process, as compared with a crown structure composed of the second conducting material such as ruthenium or the like having low mechanical strength.

Further, the base material of the lower electrode is covered with ruthenium or the like difficult to be oxidized. Therefore, when oxygen is introduced into a dielectric insulating film formed on the lower electrode, the oxidization of the base material is prevented, and oxygen is sufficiently supplied to oxygen defects of the dielectric insulating film. Accordingly, the increase of a leak current of the capacitor can be prevented.

In a method of manufacturing a semiconductor integrated circuit device according to the present invention, a crown structure is manufactured by using a first conducting material such as titanium nitride or the like as a lower electrode of a capacitor element, and a second conducting material such as ruthenium or the like is deposited on a surface of the crown structure by using a sputtering method. Thereafter, the ruthenium (sputtered ruthenium) placed in a peripheral region of the crown structure is removed by etching, and a film of ruthenium is further formed on a surface of the crown structure by using a CVD method while using the sputtered ruthenium as a seed layer.

In this method, the ruthenium placed in the peripheral region of the crown structure can be removed by etching while making the ruthenium remain on a bottom of the crown structure. When a film of a conducting material such as ruthenium or the like is further formed according to the CVD method, a film of ruthenium having an almost uniform film thickness can be formed only on the crown structure.

Accordingly, there is no contact region of the conducting material such as titanium nitride or the like used as a base material of the lower electrode with the dielectric insulating film formed on the lower electrode. Therefore, when oxygen is introduced into a dielectric insulating film formed on the lower electrode, the oxidization of the base material is prevented, and oxygen is sufficiently supplied to oxygen defects of the dielectric insulating film. Accordingly, the increase of a leak current of the capacitor can be prevented.

The above and other objects, features, and advantages of the present invention will become apparent from the following description with reference to the accompanying drawings which illustrate examples of the present invention.

DETAILED DESCRIPTION OF THE PREFERRED EMBODIMENT

In a semiconductor integrated circuit device according to the present invention, crown structures are manufactured by using a conducting material excellent in mechanical strength as a base material of lower electrodes of capacitor elements, and ruthenium is formed on surfaces of the crown structures. As the base material, titanium nitride can be selected from conducting materials conventionally used because the titanium nitride can be applied to a three-dimensional structure and has excellent mechanical strength. Hereinafter, the configuration of lower electrodes of capacitor elements using titanium nitride as a base material will be described.

Figure 4:
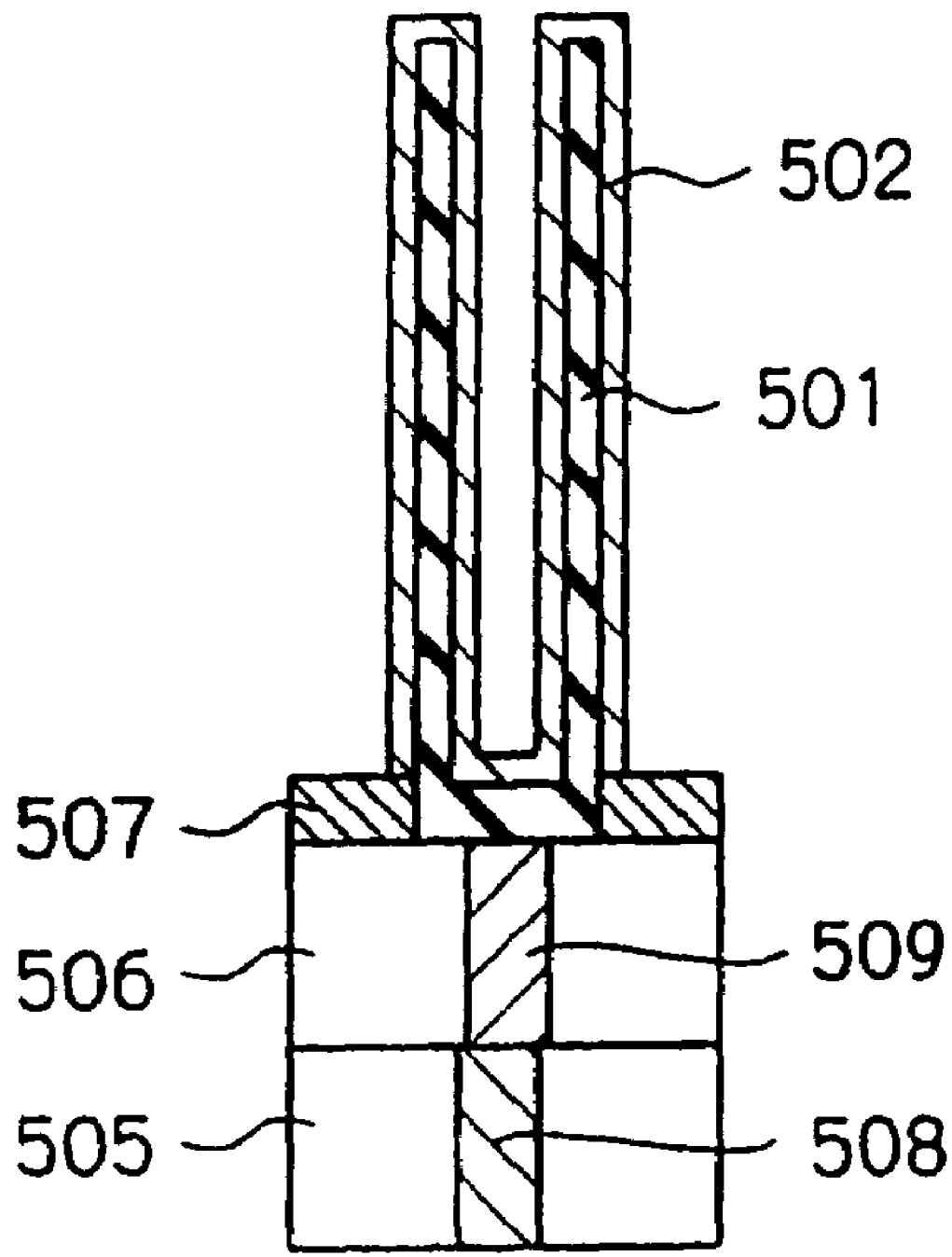
FIG. 4 is a sectional view showing an example of the configuration of a lower electrode of a capacitor element which is provided in a semiconductor integrated circuit device according to the present invention.

FIG. 4 is a sectional view showing an example of the configuration of lower electrodes of a capacitor element which is provided in a semiconductor integrated circuit device according to the present invention.

As shown in FIG. 4, a lower electrode of this embodiment is configured by covering titanium nitride 501 of a crown structure with CVD ruthenium 502. Titanium nitride 501 is connected with a drain electrode of a transistor (not shown) through second silicon plug 509 penetrating through silicon oxide 506 and first silicon plug 508 penetrating through silicon oxide 505.

When the lower electrode has the above described configuration, because titanium nitride 501 has excellent mechanical strength which is more than that of ruthenium, even though a silicon oxide supporting side surface of the crown structure is removed by wet etching after the crown structure is formed by using titanium nitride 501, a breakage or a collapse of the crown structure can be prevented.

Further, because second silicon plug 509 does not directly come in contact with CVD ruthenium 502, titanium nitride 501 also acts as a barrier metal to prevent a reaction between silicon and ruthenium.

When the lower electrode having the above-described configuration is formed according to a method described later, a new problem has arisen that a leak current of the capacitor element is increased. We examined a cause of the problem, and we realized that the problem arose because titanium nitride and tantalum oxide come in contact with each other. Hereinafter, a lower electrode forming method will be described which corresponds to the occurrence of the problem where a leak current of the capacitor element is increased.

Figure 5A:
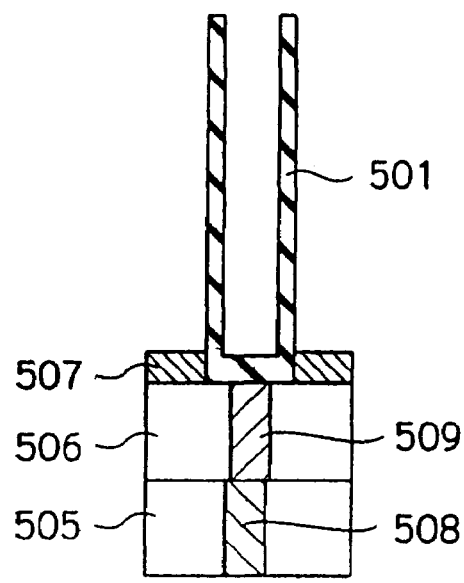
FIGS. 5A to 5C are sectional views showing an example of a process of manufacturing the lower electrode shown in FIG. 4.
Figure 5B:
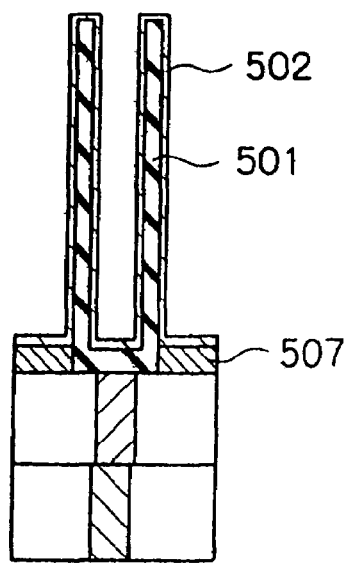
Figure 5C:
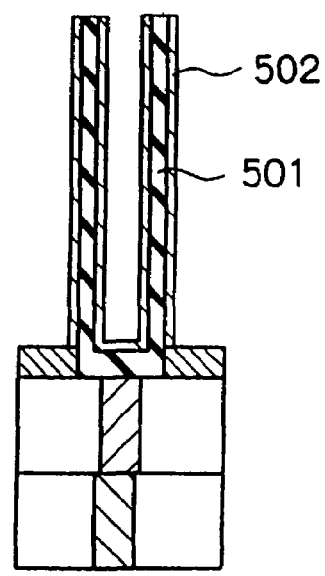

FIGS. 5A to 5C are sectional views showing an example of a method of forming the lower electrode shown in FIG. 4. In FIGS. 5A to 5C, constitutional elements of the lower electrode, which are the same as those shown in FIG. 4, are indicated by the same reference numbers as those of FIG. 4, and detailed description of the constitutional elements is omitted.

As shown in FIG. 5A, in the same manner as the method which is described in the prior art and in which the crown structures are formed by using ruthenium, titanium nitride 501 of a crown structure is formed in an opening which is formed in silicon nitride 507 placed on silicon oxide 506.

Figure 1:
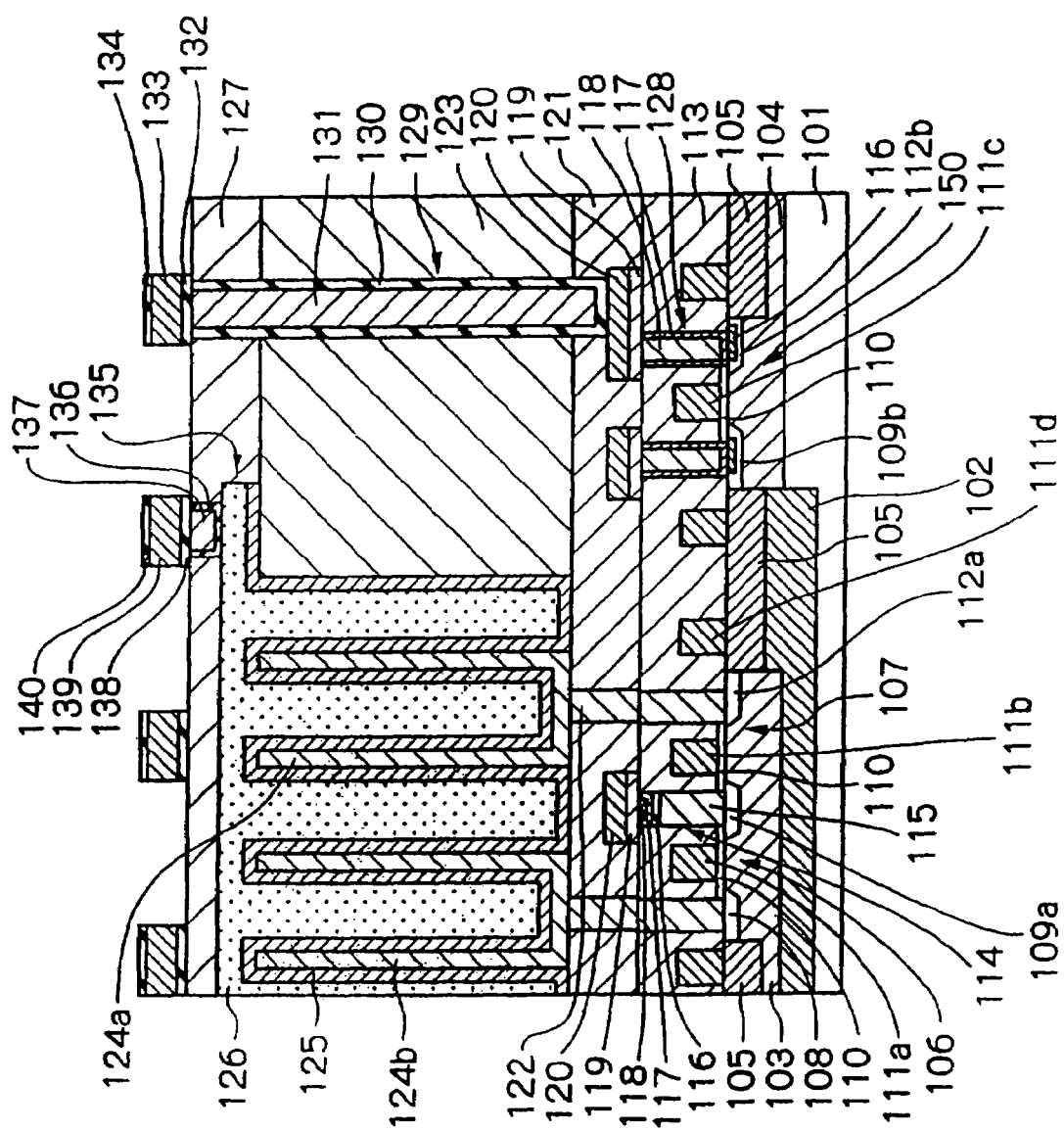
FIG. 1 is a sectional view showing an example of the configuration of a DRAM.
Figure 2A:
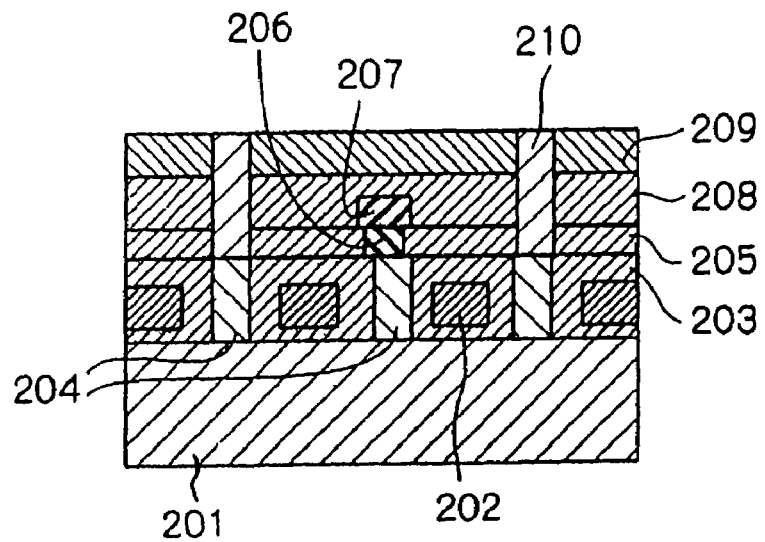
FIGS. 2A to 2G are sectional views showing a process of manufacturing conventional capacitor elements.
Figure 2B:
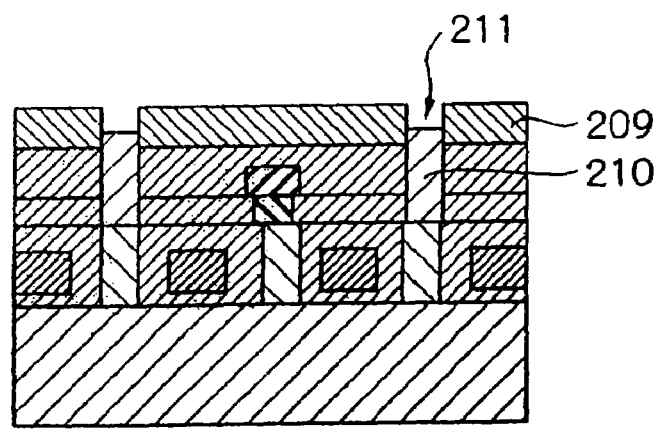
Figure 2C:
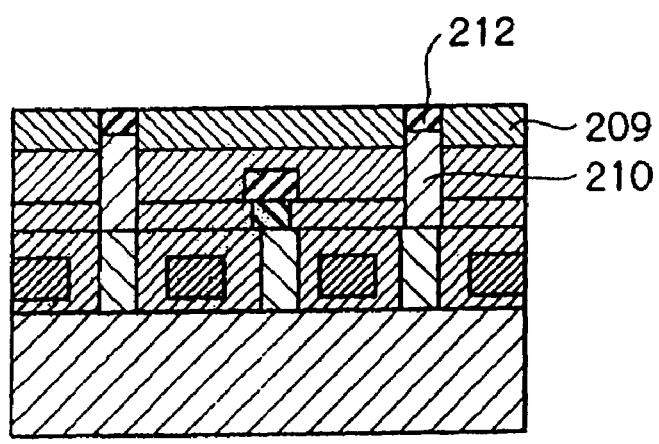
Figure 2D:
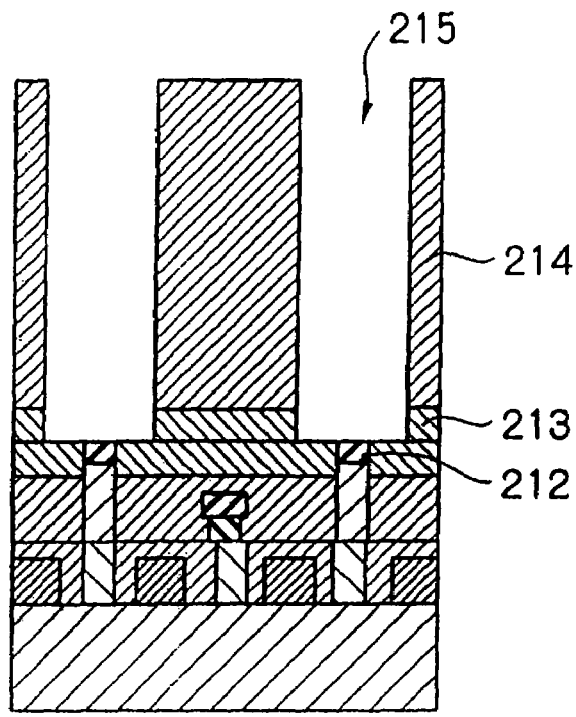
Figure 2E:
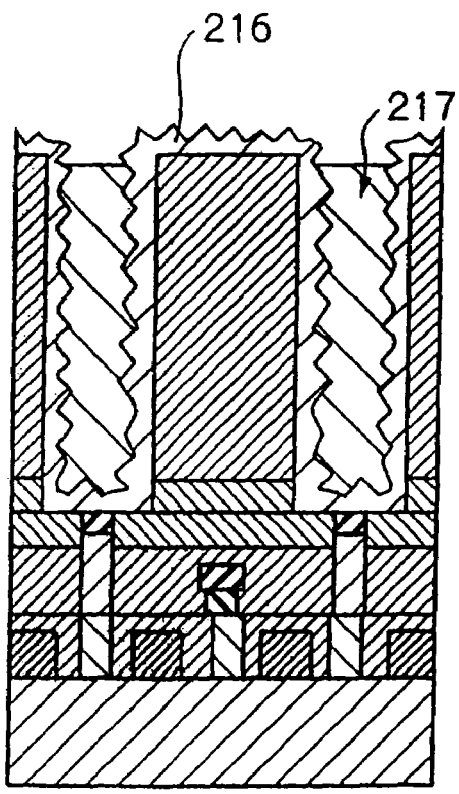
Figure 2F:
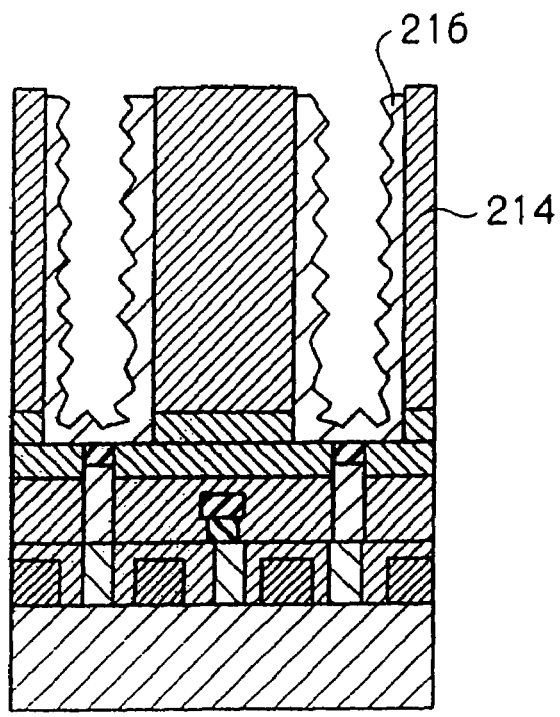
Figure 2G:
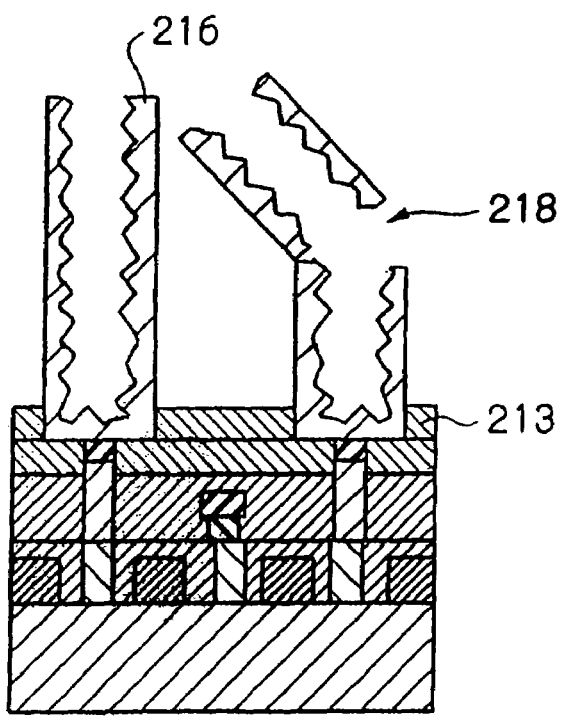
Figure 3A:
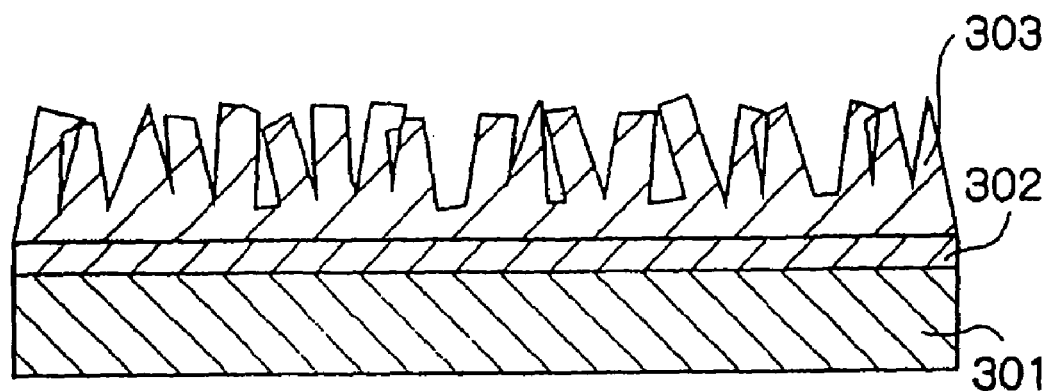
FIGS. 3A and 3B are schematic diagrams showing a result of a cross section of a ruthenium film observed by using a transmission electron microscope.
Figure 3B:
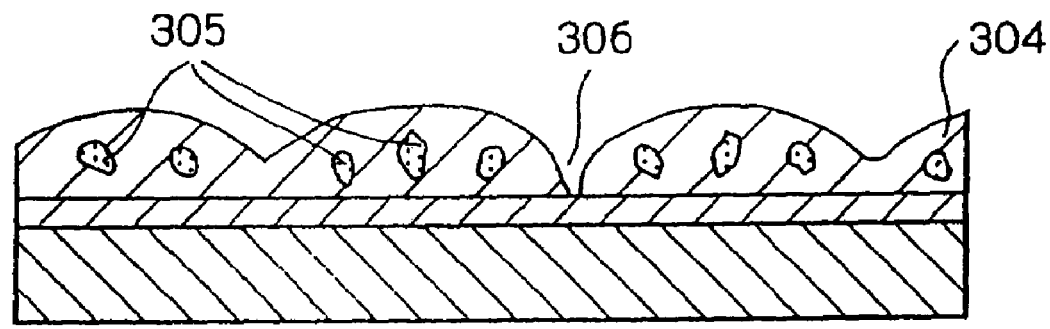

Thereafter, as a seed crystal (seed layer) for forming ruthenium, sputtered ruthenium of a film thickness of 5 nm is deposited, and CVD ruthenium of a film thickness of 20 nm is formed on the sputtered ruthenium (refer to FIG. 5B). At this time, as shown in FIG. 5B, the CVD ruthenium is formed not only on a surface of titanium nitride 501 but also on an upper surface of silicon nitride 507. In the semiconductor integrated circuit device, as shown in FIG. 1, lower electrodes of a plurality of crown structures are formed in a memory array region. Therefore, to insulate and separate the lower electrodes from each other, CVD ruthenium 502 placed on silicon nitride 507 placed between crown structures adjacent to each other is removed by the anisotropic dry etching (FIG. 5C).

In the manufacturing procedure shown in FIGS. 5A to 5C, because a film thickness of CVD ruthenium 502 formed at a head top portion of the crown structure is almost equal to that of the CVD ruthenium 502 formed in the periphery of the crown structure (refer to FIG. 5B), when the CVD ruthenium 502 in the periphery of the crown structure is removed by the anisotropic dry etching, the CVD ruthenium 502 at the head top portion of the crown structure is also etched and lost (refer to FIG. 5C).

When a dielectric insulating film composed of tantalum oxide is formed on the lower electrode in a following process, titanium nitride and tantalum oxide come in contact with each other at the head top portion of the crown structure, and an undesirable leak current flows through a contact region.

In a semiconductor integrated circuit device manufacturing method according to the present invention, sputtered ruthenium acting as a seed layer is formed only on a surface of a crown structure composed of a conducting material excellent in mechanical strength, and then CVD ruthenium is grown on the seed layer.

Hereinafter, a semiconductor integrated circuit device manufacturing method according to the present invention will be described by giving, as an example, a case where a lower electrode of a capacitor element provided in DRAM is formed. Detailed description of a method of forming a dielectric insulating film and a lower electrode is omitted.

Figure 6A:
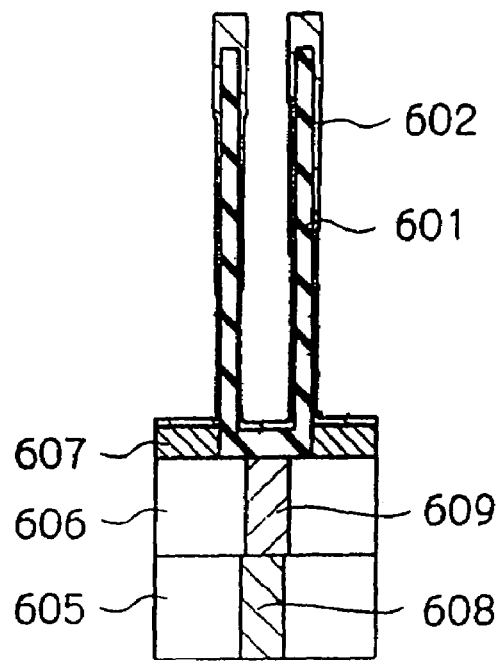
FIGS. 6A to 6C are sectional views showing a process for manufacturing the lower electrodes of the capacitor elements provided in a semiconductor integrated circuit device according to the present invention.
Figure 6B:
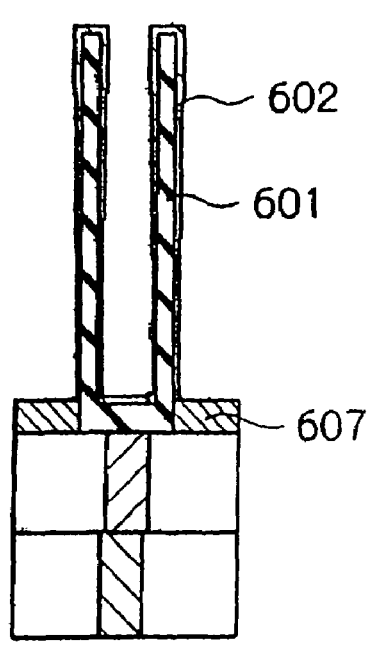
Figure 6C:
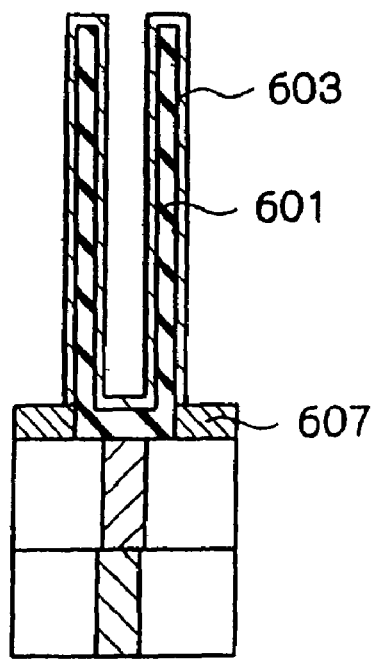

FIGS. 6A to 6C are sectional views showing a process for manufacturing a semiconductor integrated circuit device according to the present invention.

As shown in FIG. 6A, in the present invention, in the same manner as the method which is described in the prior art and in which the crown structures are formed by using ruthenium, titanium nitride 601 of a crown structure acting as a base material of a lower electrode is formed in an opening which is formed in silicon nitride 607 placed on silicon oxide 606. Titanium nitride 601 shown in FIG. 6A is connected with a drain electrode of a transistor (not shown) through second silicon plug 609 penetrating through silicon oxide 606 and first silicon plug 608 penetrating through silicon oxide 605.

A film structure of titanium nitride 601 will be described.

Figure 7:
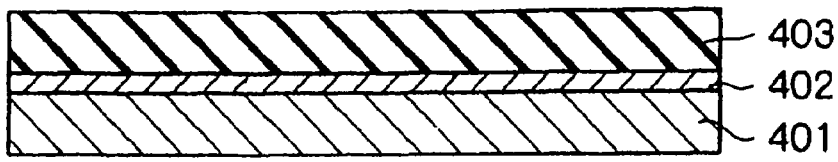
FIG. 7 is a schematic diagram showing a result obtained by observing a cross section of titanium nitride by using a transmission electron microscope.

FIG. 7 is a schematic diagram showing a result obtained by observing a cross section of titanium nitride by using a transmission electron microscope. FIG. 7 shows a structure obtained by forming silicon oxide 402 on a surface of silicon substrate 401 and forming titanium nitride 403 having a film thickness of 20 nm on silicon oxide 402 according to the CVD method.

As shown in FIG. 7, titanium nitride 403 formed according to the CVD method is a continuous film, and no defect such as a void is observed. Therefore, when a crown structure is formed by using titanium nitride, even though silicon oxide supporting the crown structure is removed, a breakage or a collapse of the crown structure can be prevented.

In the present invention, the crown structure made of titanium nitride 601 is formed, and sputtered ruthenium 602 acting as a seed layer of CVD ruthenium is formed.

As shown in FIG. 6A, sputtered ruthenium 602 is formed so as to thicken its film thickness at a head top portion of a crown structure and thin its film thickness in the periphery of the crown structure. Hereinafter, the reason for the thickness and thinness of the film will be described by using a sample of DRAM as an example. The DRAM of this sample has a memory array region in which a plurality of crown structures are formed.

Figure 8:
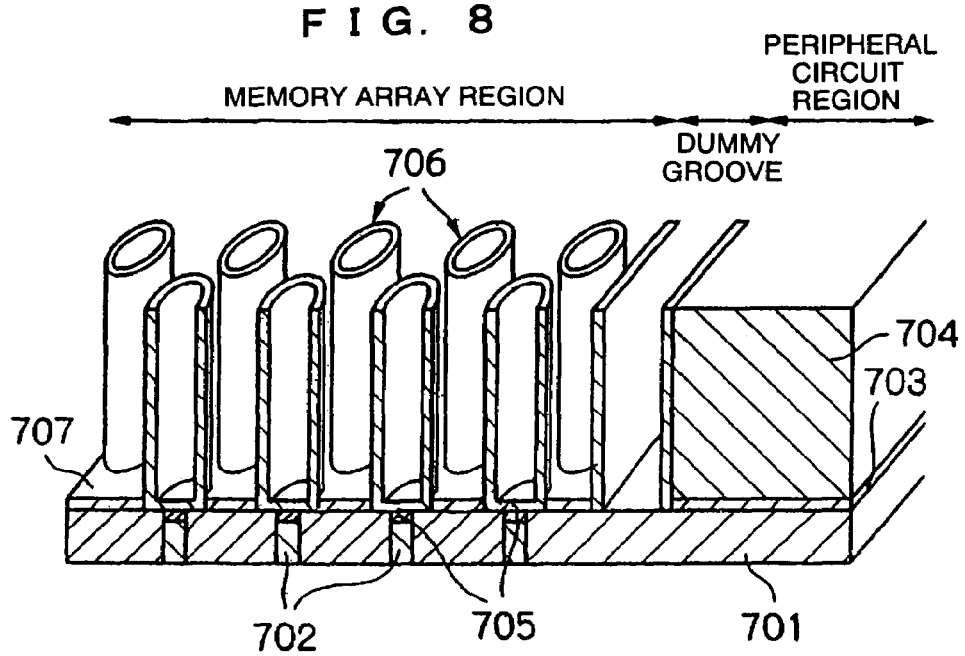
FIG. 8 is a perspective view showing a structure of a sample of the DRAM.

FIG. 8 is a perspective view showing a structure of a sample of DRAM.

DRAM shown in FIG. 8 has a memory array region having a plurality of crown structures, a peripheral circuit region and a dummy groove for separating the memory array region from the peripheral circuit region.

A plurality of openings reaching a silicon substrate (not shown) are formed in a silicon oxide 701 of the memory array region, and silicon plug 702 and titanium suicide 705 are packed into each of the openings. Crown structures 706 are formed at positions at which the crown structures are connected with titanium silicide 705 placed on silicon oxide 701.

Further, silicon nitride 703 and silicon oxide 704 are formed in that order on silicon oxide 701 of the peripheral circuit region. When silicon oxide 704 of the memory array region is removed, the dummy groove prevents silicon oxide 704 of the peripheral circuit region from being removed.

When the sample shown in FIG. 8 is, for example, applied to DRAM which has high integration corresponding to a storage capacity of 256 Mbits, the height of each crown structure from silicon nitride 703 becomes almost 1.5 μm, and the diameter of an opening of each crown structure becomes almost 0.23 μm. Sputtered ruthenium is formed on the sample having the plurality of crown structures in conventional standard conditions The sputtered ruthenium formed on the sample was observed in detail by using a transmission electron microscope. The film thickness of the sputtered ruthenium is 25 nm at head top portions of the crown structures. At bottoms of the openings of the crown structures and in crown surrounding region 707 (periphery region) of the crown structures, the film thickness of the sputtered ruthenium is 2 nm which is less than 10% of the film thickness at the head top portions.

Poor step coverage in a film formed according to the sputtering method is conventionally known. As a result, it is ascertained that step coverage is not good when the ruthenium film is formed according to the sputtering method.

Thereafter, the sputtered ruthenium of crown surrounding region 707 is removed by the anisotropic dry etching. In this etching removal, because sputtered ruthenium 602 of the head top portions of the crown structures has a large film thickness as compared with the sputtered ruthenium of crown surrounding region 707, sputtered ruthenium 602 remains. Further, because sputtered ruthenium 602 formed on the head top portions of the crown structures acts as an etching mask, sputtered ruthenium 602 formed on inner walls and outer walls of the crown structures also remains.

When the anisotropic dry etching is set to a condition in which the ruthenium of the bottoms of the openings of the crown structures is not removed, sputtered ruthenium 602 of the bottoms of the openings of the crown structures can remain. Hereinafter, the condition imposed on the anisotropic dry etching to make the ruthenium of the bottoms of the openings of the crown structures remain will be described in detail.

As described above, to insulate and separate the lower electrodes from each other, it is required to remove the ruthenium of crown surrounding region 707 shown in FIG. 8. On the other hand, when the ruthenium of the bottoms of the openings of the crown structures is removed, because a dielectric insulating film formed in a following process and the titanium nitride come in contact with each other, a leak current is increased. Therefore, it is necessary to retain the ruthenium of the bottoms of the openings of the crown structures while removing the ruthenium of crown surrounding region 707.

To examine an etching rate of the anisotropic etching for the ruthenium of the bottoms of the openings of the crown structures, a sample having a cylindrical hole formed in a shape corresponding to an inner shape of the crown structure was prepared, and we made an experiment on the sample. In detail, a plurality of samples respectively having holes were prepared. The depth of the hole in each sample is equal to that (almost 1.5 μm) of the crown structure, and opening areas of the holes of the samples differ from each other. After the anisotropic dry etching for the samples is performed, the film thickness of ruthenium remaining on the bottom of the opening of each sample was examined by using a scanning electron microscope, and an etching rate was calculated for each sample. As the etching conditions, oxygen was used for gas, a gas pressure was set to 1.0 Pa, and a degree of high frequency power was set to 800 W.

Figure 9:
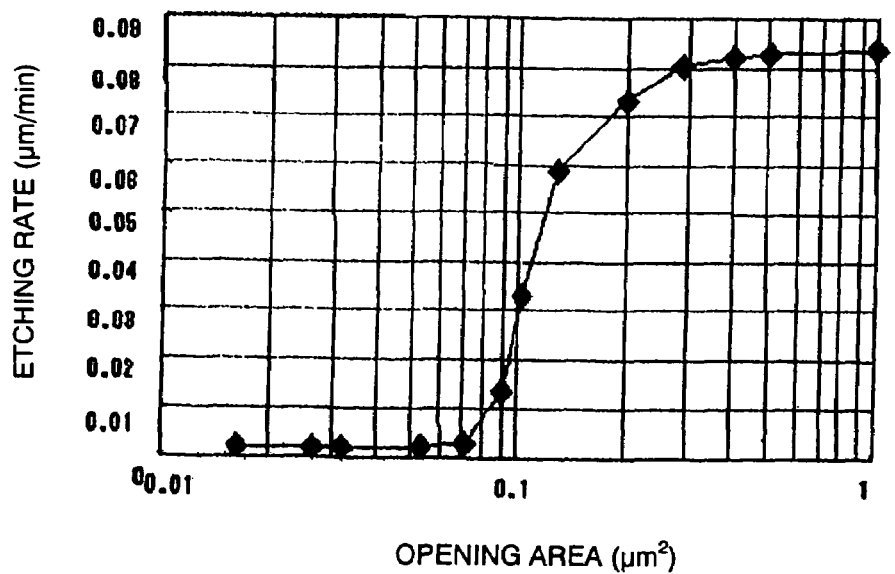
FIG. 9 is a graph showing the relation between an area of the opening of the crown structure and the etching rate.

FIG. 9 is a graph showing the relation between an area of the opening of the crown structure and the etching rate.

As shown in FIG. 9, for example, when the opening area is 0.31 $\mu m^2$ (diameter of 0.63 $\mu m$), the ruthenium is etched at a rate of almost 0.08 $\mu m/min$. When the opening area is set to 0.07 $\mu m^2$ (diameter of 0.3 $\mu m$) while gradually decreasing the opening area, the etching rate is considerably decreased, and no etching is substantially performed. As described above, it is realized that the etching rate depends on the opening area. The reason is that no oxygen ion contributing to the etching is supplied to the bottom of the opening because the opening area is decreased.

Here, when energy of the oxygen ions is changed by changing the etching conditions such as a gas pressure, a degree of high frequency power, a shape of an etching processing chamber and the like, the relation between the opening area and the etching rate can be changed.

When the etching conditions are fixed, the etching rate is fundamentally determined by the depth and opening area of the hole. The deeper the hole is and the smaller the opening area is, the lower the etching rate is, and it is difficult to etch the film of the bottom of the opening.

By estimating the result shown in FIG. 9, in case of the hole depth of 1.5 $\mu m$, when the diameter of the opening is lower than 0.3 $\mu m$, it is realized that the bottom of the opening is not substantially etched. That is, when a ratio of (depth of opening)/(diameter of opening) is set to be larger than 1.5/0.3=5, the etching can be easily controlled so as not to etch the bottom of the opening. This condition can be also applied to the crown structures.

Here, even though the ratio of (depth of opening)/(diameter of opening) is smaller than 5, by changing the etching conditions described above, the etching can be controlled so as not to etch the bottom of the opening.

By estimating the result of the experiments, in case of a crown structure having a typical size (depth of 1.5 $\mu m$, opening area of 0.04 $\mu m^2$ (diameter of 0.23 $\mu m$)) so as to be applicable to DRAM having a storage capacity of 256 Mbits, it can be ascertained that the bottom of the opening of the crown structure is not etched.

On the other hand, because the size of crown surrounding region 707 is equivalent to an opening area which is larger than 0.07 $\mu m^2$ of the graph shown in FIG. 9, the etching for the ruthenium is not stopped. Accordingly, the ruthenium formed in crown surrounding region 707 can be removed while retaining the ruthenium of the bottoms of the openings of the crown structures. Here, when the ruthenium formed in crown surrounding region 707 is removed, the ruthenium on the head top portions of the crown structures can be also reduced. However, because the film thickness on the head top portions is sufficiently large as compared with that of crown surrounding region 707, the ruthenium on the head top portions does not disappear.

After the removal of the ruthenium, because the deposited sputtered ruthenium acting as a seed layer remains only on the head top portions, the side walls and the bottoms of the openings (refer to FIG. 6B) of the crown structure, when the insulating film such as silicon nitride 607 or the like placed in the region other than the head top portions of the crown structure, the side walls of titanium nitride 601 and the bottoms of the openings is used, a film of CVD ruthenium 603 can be selectively formed only on titanium nitride 601 (FIG. 6C).

Hereinafter, a method of selectively forming a film of CVD ruthenium will be described.

Figure 10:
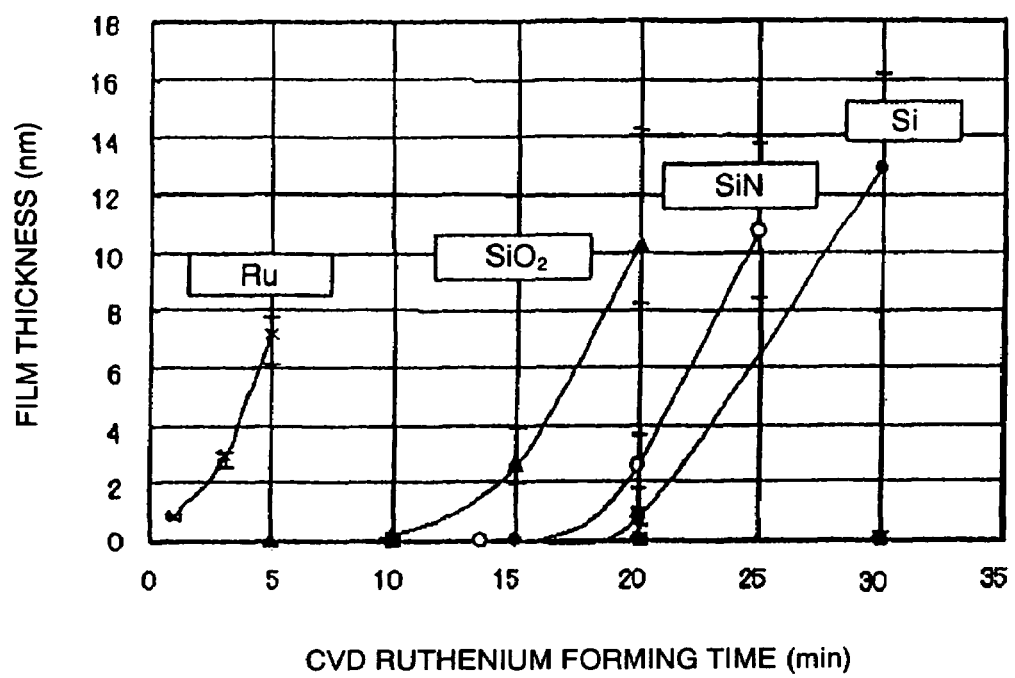
FIG. 10 is a graph showing the relation between a film forming time of CVD ruthenium and a film thickness of CVD ruthenium to indicate a change of the relation in dependence on a base material.

FIG. 10 is a graph showing the relation between a film forming time of CVD ruthenium and a film thickness of the CVD ruthenium to indicate a change of the relation in dependence on a base material. In the graph shown in FIG. 10, each of sputtered ruthenium (Ru), silicon oxide ($SiO_2$), silicon nitride (SiN) and silicon substrate (Si) is used as a base material.

As shown in FIG. 10, in case of the sputtered ruthenium used as a base material, the film growth of the CVD ruthenium is started without being substantially delayed after the supply of a source gas. On the other hand, in case of the silicon oxide used as a base material, the film growth of the CVD ruthenium is started when almost ten minutes passes after the supply of a source gas. In case of the silicon nitride used as a base material, the film growth of the CVD ruthenium is started when almost fifteen minutes passes after the supply of a source gas. In case of the silicon used as a base material, the film growth of the CVD ruthenium is started when almost twenty minutes passes after the supply of a source gas.

Accordingly, when the semiconductor integrated circuit device is configured by depositing sputtered ruthenium 602 on the surface of the crown structure composed of titanium nitride 601 and placing the insulating film such as silicon nitride 607 or the like in the other region (refer to FIG. 6B), a film of the CVD ruthenium is formed only on sputtered ruthenium 602 by estimating the graph shown in FIG. 10. In addition, when a supply time of the source gas is controlled not to form a film of the CVD ruthenium on the surface of the insulating film, the film of the CVD ruthenium can be selectively formed.

Next, a method of manufacturing a capacitor element having lower electrodes will be described in detail.

Figure 11A:
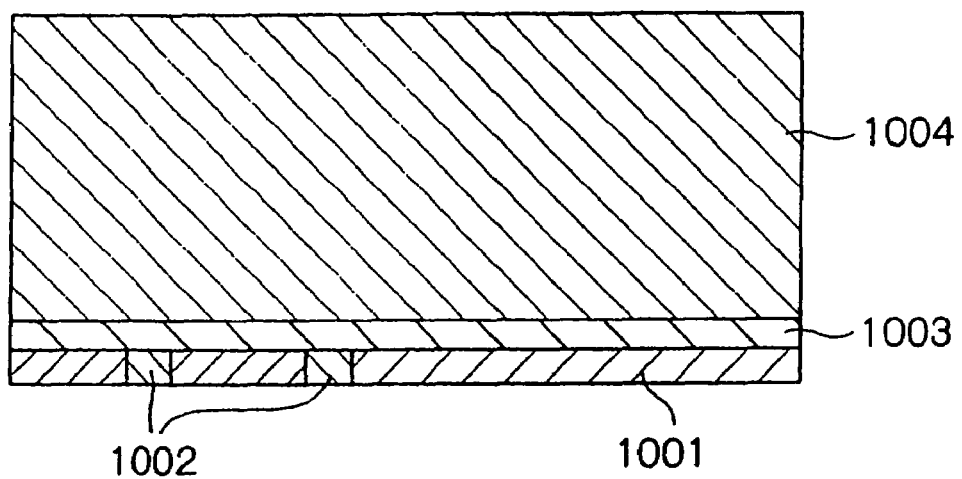
FIGS. 11A to 11Q are sectional views showing a process of manufacturing capacitor elements provided in the semiconductor integrated circuit device according to the present invention.
Figure 11B:
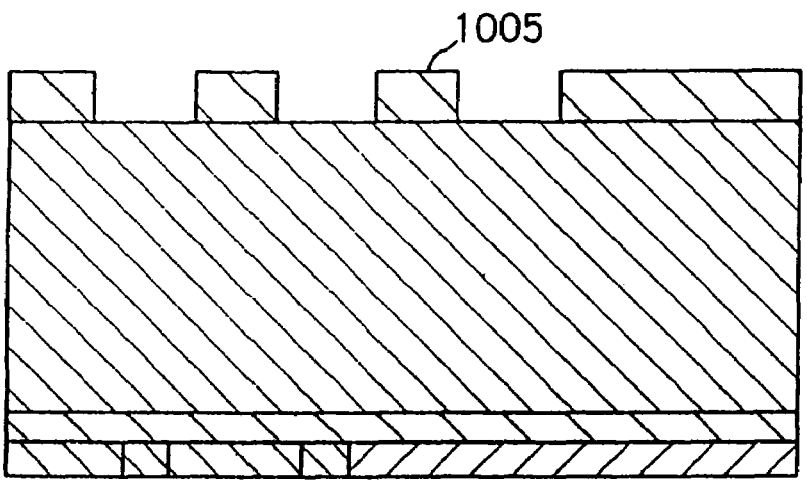
Figure 11C:
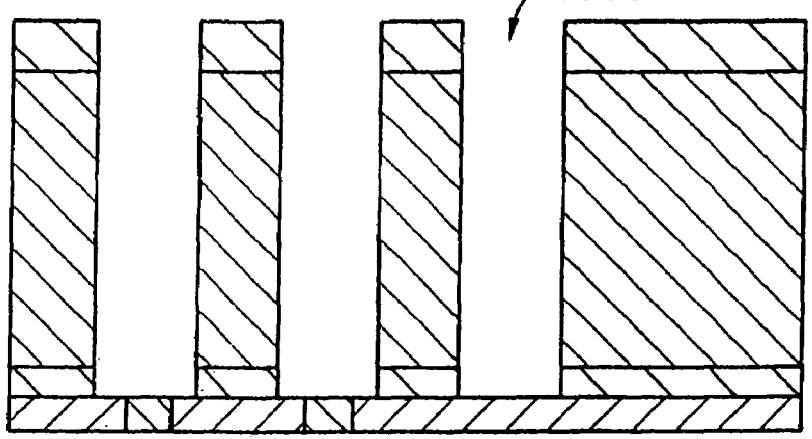
Figure 11D:
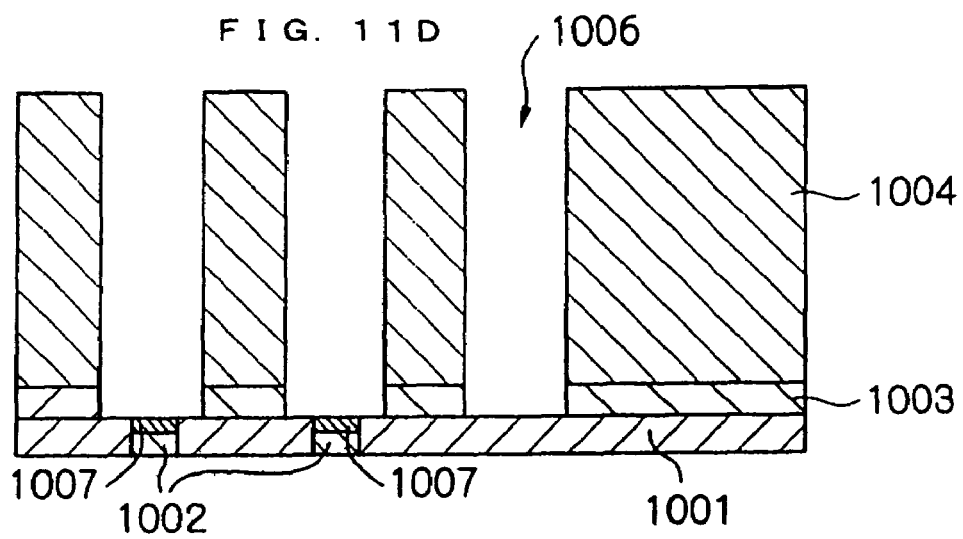
Figure 11E:
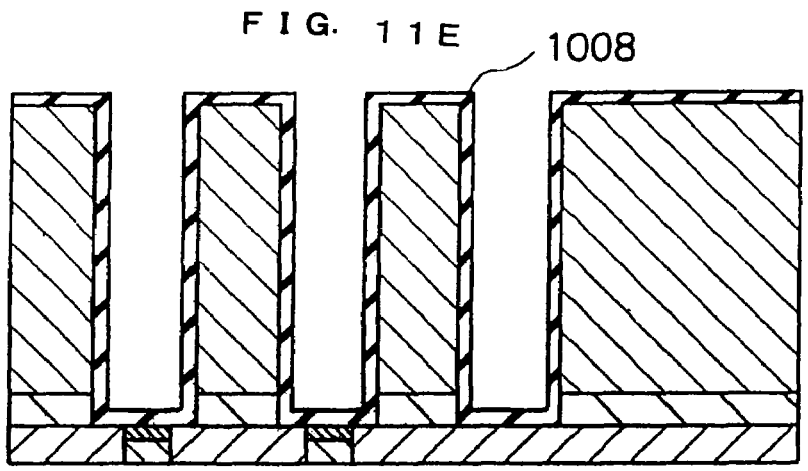
Figure 11F:
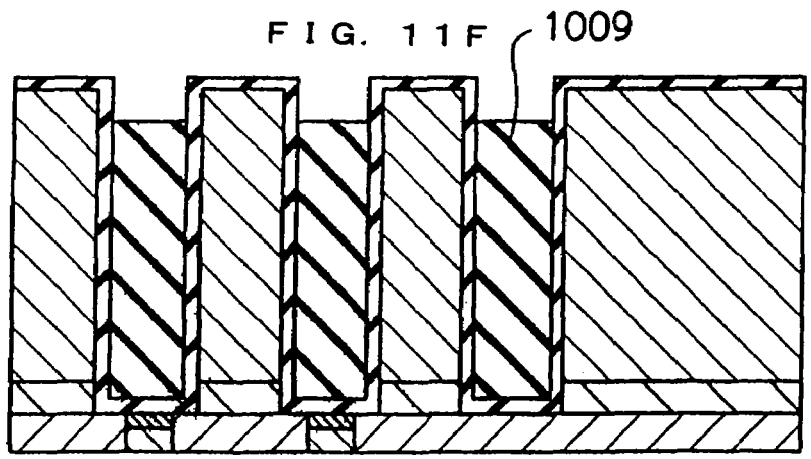
Figure 11G:
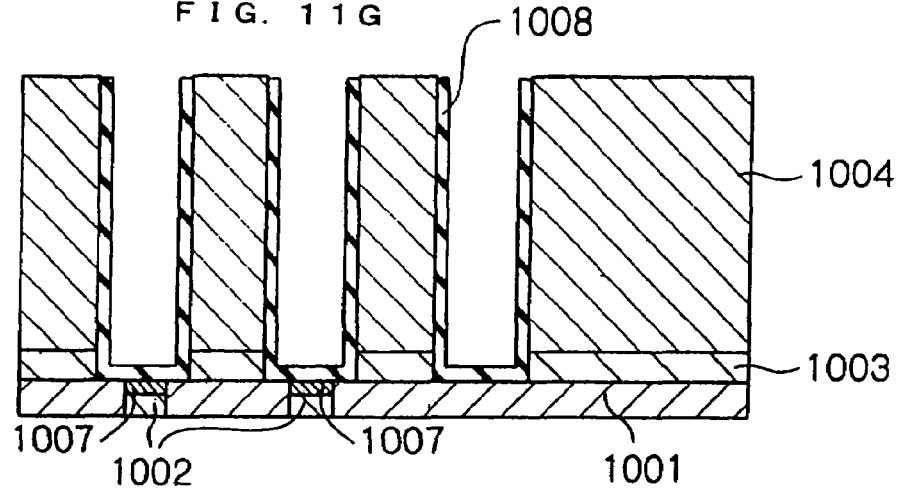
Figure 11H:
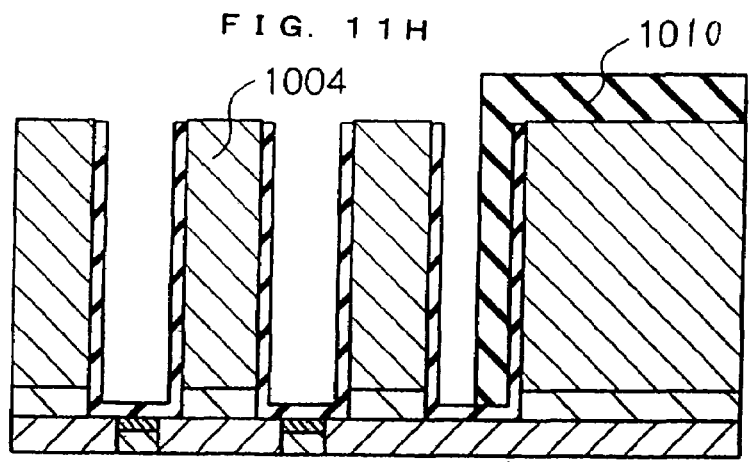
Figure 11I:
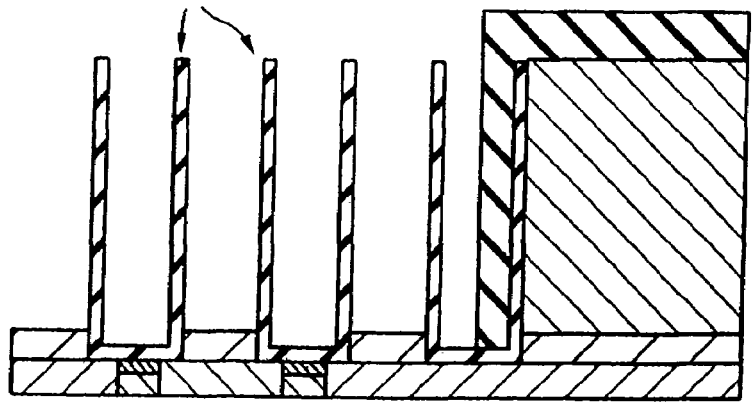
Figure 11M:
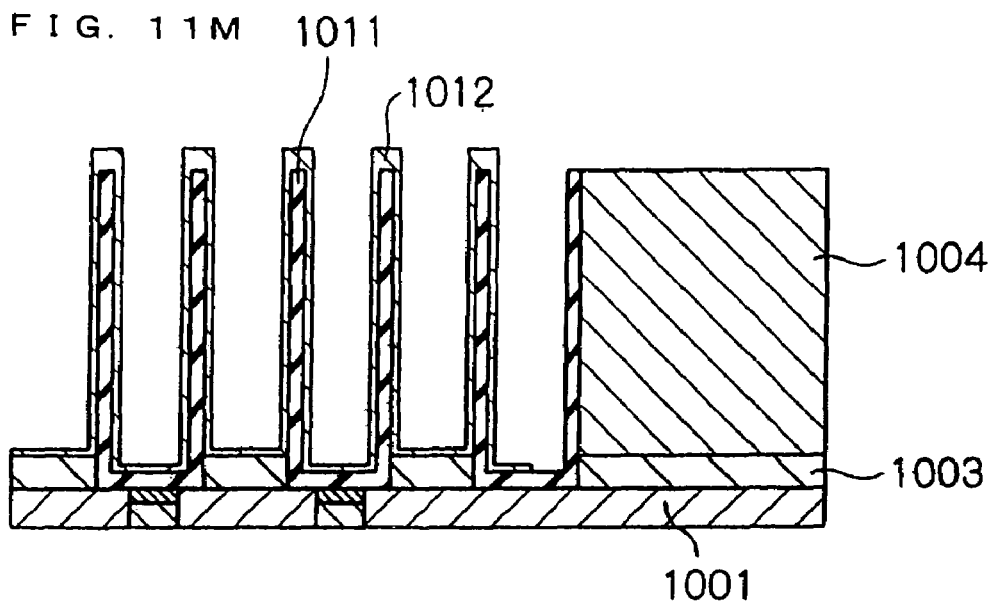
Figure 11N:
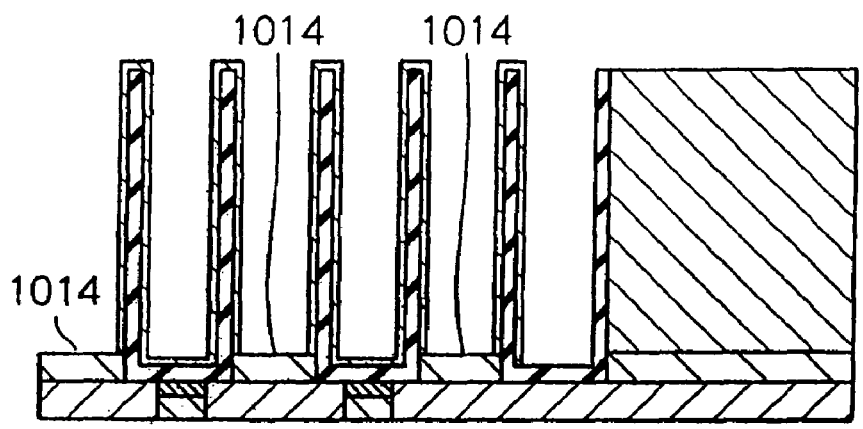
Figure 11O:
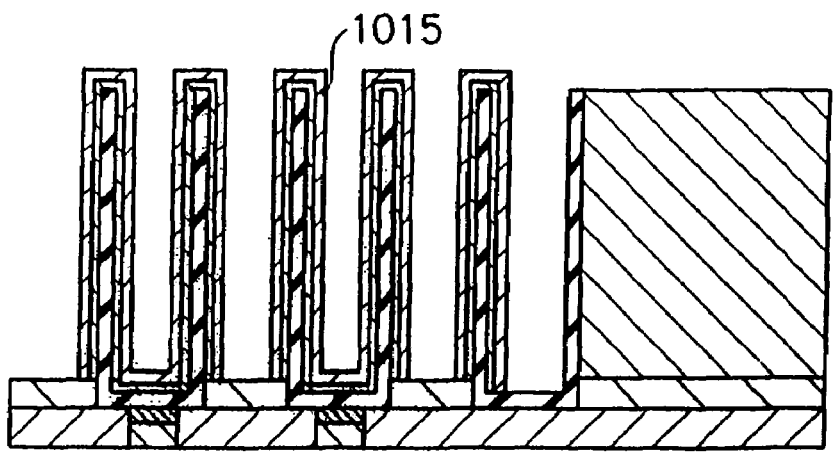
Figure 11P:
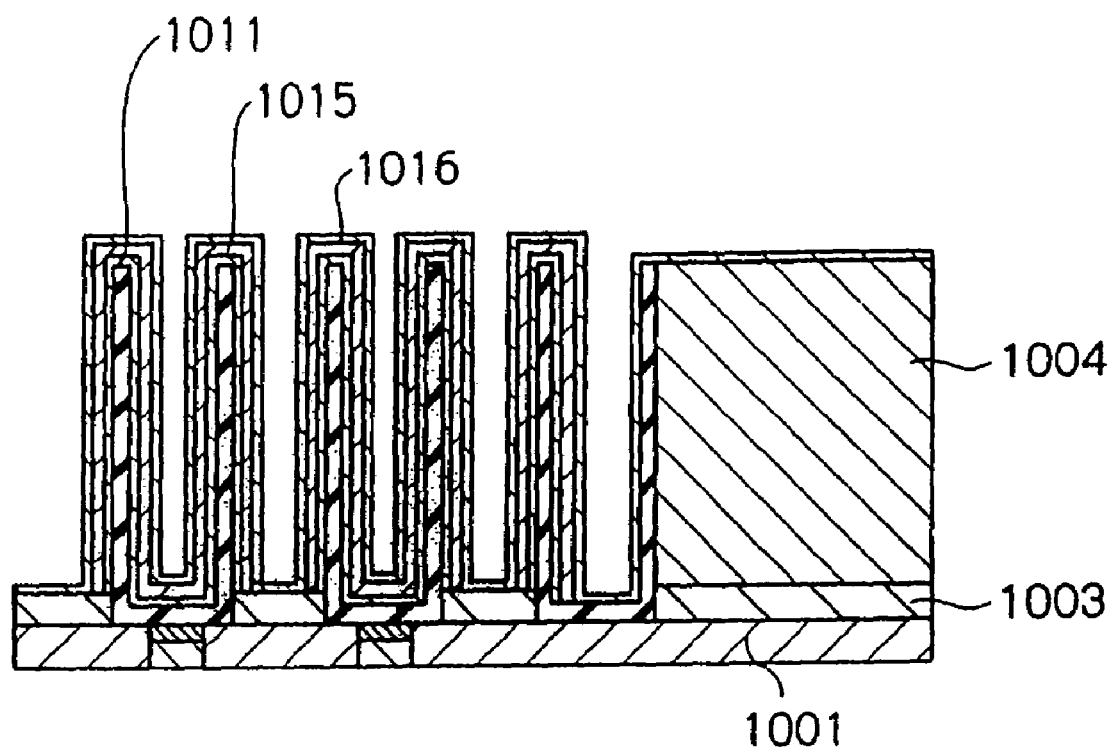
Figure 11Q:
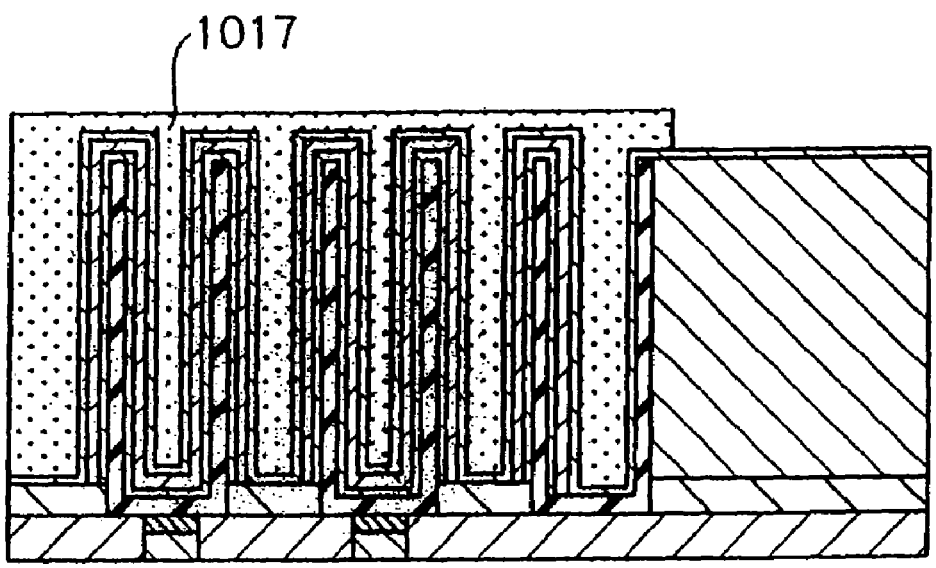

FIGS. 11A to 11Q are sectional views showing a process of manufacturing capacitor elements provided in the semiconductor integrated circuit device according to the present invention. Detailed description for the same processes as those in the prior art is omitted.

As shown in FIG. 11A, in the same manner as in the prior art, after word lines and bit lines are formed on a silicon substrate (not shown), silicon oxide 1001 acting as a interlayer insulating film is deposited on the silicon substrate. Thereafter, openings reaching the silicon substrate are formed in predetermined portions of silicon oxide 1001. After silicon plugs 1002 are packed into the openings, both silicon nitride 1003 and silicon oxide 1004 used for forming cylinders of capacitor elements are deposited. A film thickness of silicon nitride 1003 is 50 nm, and a film thickness of silicon oxide 1004 is 1500 nm.

Thereafter, as shown in FIG. 11B, photoresist 1005 having a pattern of openings is formed on silicon oxide 1004 so as to place the openings on cylinder forming portions, and portions of silicon nitride 1003 and silicon oxide 1004 not covered with photoresist 1005 used as a mask are removed according to the anisotropic dry etching until upper surfaces of silicon plugs 1002 are exposed. In this anisotropic dry etching, dummy groove 1006 shown in FIG. 8 is also formed simultaneously (FIG. 11C).

Thereafter, photoresist 1005 is removed. After a predetermined washing process is performed, portions of silicon plugs 1002 placed at regions ranging from upper surfaces thereof to a predetermined depth are removed, and titanium silicide 1007 is buried in openings formed on remaining silicon plugs 1002 (FIG. 11D). As a method of forming titanium suicide 1007, a method of performing heat treatment after burying titanium or a method of performing heat treatment while burying titanium is adopted.

Thereafter, a film of titanium nitride 1008 is formed on the entire surface at a film thickness of 20 nm according to the CVD method by using titanium tetrachloride (TiCl$_4$) and ammonia (NH$_3$) as a raw material gas (FIG. 11E). This process of forming titanium nitride 1008 may be successively performed in the same apparatus as that for the formation of titanium silicide 1007.

Thereafter, as shown in FIG. 11F, the inside of each cylinder is filled with photoresist 1009 by using a known photolithography technique.

Thereafter, the film of titanium nitride 1008 formed on an upper surface of silicon oxide 1004 is removed by using the anisotropic dry etching, and photoresist 1009 filled into the inside of each cylinder and dummy groove 1006 is removed (FIG. 11G).

Thereafter, photoresist 1010 is formed so as to cover the peripheral circuit region. At this time, photoresist 1010 is formed so as to also cover a side wall of dummy groove 1006 facing on the side of the peripheral circuit region (FIG. 11H).

Thereafter, silicon oxide 1004 of the memory array region is removed by using an etching liquid including hydrofluoric acid (HF), and the production of crown structures 1011 composed of titanium nitride 1008 is completed (FIG. 11I).

Thereafter, photoresist 1010 is removed (FIG. 11J), and sputtered ruthenium 1012 is formed on the entire surface at a film thickness of almost 25 nm according to the sputtering method (FIG. 11K). At this time, very thin ruthenium is formed on the bottoms of the openings of crown structures 1011 at a film thickness of almost 2 nm.

Thereafter, as shown in FIG. 11L, photoresist 1013 is formed so as to cover the memory array region, sputtered ruthenium 1012 exposed in the peripheral circuit region is removed in an oxygen plasma process, and photoresist 1013 is removed by using an organic release liquid including phenol (FIG. 11M).

Thereafter, on condition that sputtered ruthenium 1012 remains on the bottoms of the openings of crown structures 1011, the anisotropic dry etching is performed so as to remove ruthenium of crown surrounding region 1014 and makes ruthenium remain on the entire surface of crown structures 1011 including the head top portions of crown structures 1011 (FIG. 11N).

Thereafter, the washing process is performed by using the organic release liquid, and a film of CVD ruthenium 1015 is formed at a film thickness of 20 nm by controlling a supply time of a source gas so as to make a film of ruthenium grow only on sputtered ruthenium 1012 (FIG. 11O). This CVD ruthenium 1015 is formed at a temperature of 300° C. and a pressure of 400 Pa while using Ru(EtCp)$_2$ as a raw material gas and using oxygen as an oxidizing agent. As a result, lower electrodes of the crown structures, of which surfaces are coated with CVD ruthenium 1015 are formed while using titanium nitride 1008 as a base material.

Here, as described above, CVD ruthenium 1015 is formed in a cylindrical shape just after the film formation and includes oxygen as impurities. Therefore, to flatten the film and remove the impurities, it is desired to perform heat treatment in the atmosphere of a reducing gas at a temperature of almost 600° C. Further, to heighten the continuity of the ruthenium film, a multi-stage film forming method for performing film formation and heat treatment a plurality of times may be used. In the multi-stage film forming method, for example, in case of the formation of a film having a thickness of 20 nm, a first film having a thickness of 10 nm is formed in a first stage, a surface of the first film is flattened by performing heat treatment, a second film having a thickness of 10 nm is formed in a second stage, and heat treatment is performed for the second film.

After completing the process shown in FIG. 11O, a film of tantalum oxide 1016 acting as a dielectric insulating film is formed at a film thickness of 12 nm according to the CVD method (FIG. 11P). This tantalum oxide 1016 is formed at a temperature of 420° C. and a pressure of 60 Pa while using Ta(OC$_2$H$_5$)$_5$ as a raw material gas and using oxygen as an oxidizing agent.

Thereafter, carbonaceous impurities included in tantalum oxide 1016 are removed, and heat treatment is performed in the oxidizing atmosphere to introduce oxygen into portions of removed impurities. As gas used for the oxidizing atmosphere, not only gas including oxygen molecules or oxygen atoms such as O$_2$, N$_2$O or the like but also gas obtained by activating oxygen molecules or oxygen atoms to a plasma state or active oxygen obtained from ozone gas can be used. Tantalum oxide 1016 is formed into a continuous film by merely forming a film. However, tantalum oxide 1016 includes carbonaceous impurities. Therefore, when a capacitor element is composed of tantalum oxide 1016, a leak current is increased by the impurities. Accordingly, heat treatment in the oxidizing atmosphere is effective.

Here, when the multi-stage film forming method is used for the formation of tantalum oxide, a film having reliability higher than that of a film formed by performing heat treatment for a film having a desired film thickness and formed at once can be obtained. For example, when a film of tantalum oxide having a film thickness of 12 nm is formed according to the multi-stage film forming method, a first film having a thickness of 6 nm is formed in a first stage, heat treatment is performed for the first film in the N$_2$O atmosphere, a second film having a thickness of 6 nm is formed on the first film in a second stage, and heat treatment is performed for the second film in the N$_2$O atmosphere. As a method of heat treatment, one method can be selected from various combinations of conditions. For example, one heat treatment process may be set by combining plasma oxidization at a temperature of 400° C. and heat treatment in the non-oxidizing atmosphere at a temperature of 600° C., and this heat treatment process may be applied to the multi-stage film forming method.

After the process shown in FIG. 11P is completed, ruthenium acting as an upper electrode is deposited, and the ruthenium is flattened by performing heat treatment for the ruthenium at a temperature of almost 400° C. Thereafter, the ruthenium is patterned so as to cover the memory array region by using the known photolithography technique and the etching technique, and an upper electrode (plate electrode) 1017 is formed at a position opposite to the lower electrodes with tantalum oxide 1016 between upper electrode 1017 and the group of lower electrodes. In the same manner as the lower electrodes, this upper electrode 1017 is obtained by forming sputtered ruthenium for a seed layer and forming a film of CVD ruthenium. Here, upper electrode 1017 may have the configuration that a different conducting material such as tungsten is stacked on the ruthenium. Thereafter, the manufacturing of DRAM is completed by repeatedly performing the process of forming a interlayer insulating film and wiring if necessary.

In the semiconductor integrated circuit device according to the present invention, titanium nitride excellent in mechanical strength and forming a dense film as compared with ruthenium is used as a base material of the lower electrodes. Accordingly, breakage and collapse of the lower electrodes caused by poor morphology of ruthenium formed according to the CVD method and the lowering of the mechanical strength due to the existence of voids in the film can be prevented, and yield of the semiconductor integrated circuit device can be improved.

Further, the cylindrical crown structures are composed of titanium nitride additionally acting as a barrier metal, the sputtered ruthenium is deposited so as to enlarge a film thickness of the sputtered ruthenium at the head top portions of the crown structures as compared with a film thickness in the peripheral region of the crown structures, the ruthenium placed in the peripheral region of the crown structures is removed by performing the anisotropic etching on condition that the ruthenium remains at the bottoms of the openings of the crown structures, the CVD ruthenium is grown only on the seed layer, and the lower electrodes of the titanium nitride are formed while covering the titanium nitride with the CVD ruthenium having an almost uniform film thickness. Accordingly, the contact of the titanium nitride with the dielectric insulating film formed so as to cover the lower electrodes in a flowing process can be avoided, and the increase of a leak current of the capacitor element can be prevented.

In this embodiment, DRAM is described as the semiconductor integrated circuit device having the capacitor element. However, the present invention is not limited to DRAM and can be applied to any type of semiconductor integrated circuit device having a capacitor element.

Further, in this embodiment, an example using titanium nitride as a base material of the lower electrodes is described. However, any type of material including metal can be applied as a base material of the lower electrodes. The lower electrodes excellent in mechanical strength can be obtained by using a metal compound including metal as a base material of the lower electrodes.

Moreover, in this embodiment, the lower electrodes formed in a cylindrical shape (crown structures) and sealed at bottoms thereof are described as an example. However, the shape of the lower electrodes is not limited to the cylindrical shape, and the lower electrodes may be formed in an elliptical shape or one of other shapes.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor integrated circuit device having plural capacitor elements, the method comprising the steps of:

forming plural cylindrical crown structures of a first conducting material in a first insulating film on a substrate of the device, parts of the first insulating film being between bases of each of said plural cylindrical crown structures;

depositing a second conducting material on interior and exterior walls and an interior bottom of each of said cylindrical crown structures and on the first insulating material between said plural cylindrical crown structures, said second conducting material being more difficult to oxidize than said first conducting material, said second conducting material being thicker at tops of said cylindrical crown structures than at the interior bottoms thereof;

removing said second conducting material from said first insulating material between said plural cylindrical crown structures and in a same step decreasing a thickness of said second conducting material at the tops of said cylindrical crown structures while retaining at least part of said second conducting material at the tops, on the interior and exterior walls, and on the interior bottom of each of said cylindrical crown structures;

following the removing step, growing a film of said second conducting material on the tops, interior and exterior walls and interior bottom of each of said cylindrical crown structures using the previously deposited said second conducting material as a seed for said film;

applying a second insulating film on the film of said second conducting material on the tops, the interior and exterior walls and the interior bottom of each of said cylindrical crown structures and on the first insulating material between said plural cylindrical crown structures; and introducing oxygen into said second insulating film.

* * * * *